(12) United States Patent
Li et al.

(10) Patent No.: US 11,744,131 B2
(45) Date of Patent: Aug. 29, 2023

(54) OLED DEVICE, METHOD OF MANUFACTURING THE SAME, AND DISPLAY PANEL

(71) Applicant: BOE TECHNOLOGY GROUP CO., LTD., Beijing (CN)

(72) Inventors: Xiaohu Li, Beijing (CN); Huajie Yan, Beijing (CN); Hongsheng Zhan, Beijing (CN); Tun Liu, Beijing (CN); Zhiqiang Jiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/806,919

(22) Filed: Jun. 14, 2022

(65) Prior Publication Data

US 2022/0310700 A1 Sep. 29, 2022

Related U.S. Application Data

(63) Continuation of application No. 16/492,265, filed as application No. PCT/CN2019/078881 on Mar. 20, 2019, now Pat. No. 11,404,490.

(30) Foreign Application Priority Data

Apr. 13, 2018 (CN) .......................... 201810331748.8

(51) Int. Cl.
*H10K 59/38* (2023.01)
*H10K 50/15* (2023.01)
(Continued)

(52) U.S. Cl.
CPC ........... *H10K 59/38* (2023.02); *H10K 50/156* (2023.02); *H10K 50/813* (2023.02);
(Continued)

(58) Field of Classification Search
CPC ............... H01L 27/322; H01L 27/3218; H01L 27/3244; H01L 51/5064; H01L 51/5209;
(Continued)

(56) References Cited

U.S. PATENT DOCUMENTS 9,425,435 B2 8/2016 Ando
10,297,792 B2 5/2019 Park et al.
(Continued)

FOREIGN PATENT DOCUMENTS

CN 104247080 A 12/2014
CN 105633115 A 6/2016
(Continued)

OTHER PUBLICATIONS

First Chinese Office Action dated Apr. 12, 2019, for corresponding Chinese Application No. 201810331748.8.
(Continued)

*Primary Examiner* — Karen Kusumakar
*Assistant Examiner* — Adam S Bowen
(74) *Attorney, Agent, or Firm* — Kinney & Lange, P.A.

(57) ABSTRACT

Embodiments of the present disclosure provide an OLED device, a method of manufacturing the OLED device, and a display panel. The OLED device comprises: a substrate, a first electrode layer, a color filter layer, a light emitting layer and a second electrode layer. The first electrode layer is one of an anode layer or a cathode layer and comprises: a first sub-electrode layer disposed on the substrate; and a second sub-electrode layer electrically connected with the first sub-electrode layer. The color filter layer is disposed on the first sub-electrode layer and the second sub-electrode layer is disposed on the color filter layer. The second electrode layer is the other of the anode layer or the cathode layer and
(Continued)

the light emitting layer is disposed between the second electrode layer and the second sub-electrode layer of the first electrode layer.

18 Claims, 2 Drawing Sheets

(51) Int. Cl.
*H10K 50/813* (2023.01)
*H10K 50/816* (2023.01)
*H10K 50/822* (2023.01)
*H10K 59/12* (2023.01)
*H10K 59/35* (2023.01)
*H10K 71/00* (2023.01)

(52) U.S. Cl.
CPC ......... *H10K 50/816* (2023.02); *H10K 50/822* (2023.02); *H10K 59/12* (2023.02); *H10K 59/353* (2023.02); *H10K 71/00* (2023.02)

(58) Field of Classification Search
CPC . H01L 51/5215; H01L 51/5225; H01L 51/56; H01L 51/5265; H01L 27/3211; H01L 51/5218; H01L 51/5284; H10K 59/38; H10K 50/156; H10K 50/813; H10K 50/816; H10K 50/822; H10K 59/12; H10K 59/353; H10K 71/00; H10K 50/818; H10K 50/852; H10K 59/35; H10K 50/865
See application file for complete search history.

(56) References Cited

U.S. PATENT DOCUMENTS

| | | |
|---|---|---|
| 2011/0229994 A1 | 9/2011 | Jung |
| 2012/0319564 A1 | 12/2012 | Ghosh et al. |
| 2013/0285023 A1 | 10/2013 | Kurata et al. |
| 2014/0203271 A1* | 7/2014 | Yoneda ............... H01L 27/3211 257/40 |
| 2015/0108446 A1 | 4/2015 | Ando |
| 2018/0062116 A1 | 3/2018 | Park et al. |
| 2018/0130971 A1* | 5/2018 | Asozu ................ H01L 51/5253 |
| 2021/0366994 A1 | 11/2021 | Li et al. |

FOREIGN PATENT DOCUMENTS

| | | |
|---|---|---|
| CN | 107799563 A | 3/2018 |
| CN | 108565350 A | 9/2018 |
| JP | 2015090817 A | 5/2015 |

OTHER PUBLICATIONS

English translation of International Search Report and Written Opinion dated May 29, 2019, for corresponding PCT Application No. PCT/CN2019/078881.

U.S. Non-Final Rejection dated Dec. 27, 2021, for parent U.S. Appl. No. 16/492,265.

U.S. Notice of Allowance dated Mar. 30, 2022, for parent U.S. Appl. No. 16/492,265.

* cited by examiner

OLED DEVICE, METHOD OF MANUFACTURING THE SAME, AND DISPLAY PANEL

CROSS-REFERENCE TO RELATED APPLICATIONS

This application is a continuation of U.S. patent application Ser. No. 16/492,265 filed on Sep. 9, 2019, which is a Section 371 National Stage Application of International Application No. PCT/CN2019/078881, filed on Mar. 20, 2019, entitled "OLED DEVICE, METHOD OF MANUFACTURING THE SAME, AND DISPLAY PANEL", which in turn claims priority to Chinese Application No. 201810331748.8, filed on Apr. 13, 2018, all of which are incorporated herein by reference in their entireties.

TECHNICAL FIELD

Embodiments of the present disclosure relate to an organic light-emitting diode (OLED) device, a method of manufacturing the same, and a display panel having the OLED device.

BACKGROUND

In an OLED device, lengths of microcavities of a red OLED, a green OLED and a blue OLED are different. For example, a difference between the length of the microcavity of a light emitting region of the blue OLED and the length of the microcavity of a light emitting region of the green OLED is 490 Å, and a difference between the length of the microcavity of the light emitting region of the blue OLED and the length of the microcavity of a light emitting region of the red OLED is 980 Å. Generally, additional hole transport layers are disposed in the green OLED and the red OLED to increase the lengths of the microcavities of them, respectively. In a production process, in order to manufacture the additional hole transport layers in the green OLED and the red OLED, additional fine metal masks are usually required.

SUMMARY

Embodiments of the present disclosure provide an OLED device including: a substrate; a first electrode layer, which is one of an anode layer or a cathode layer, and which includes a first sub-electrode layer disposed on the substrate and a second sub-electrode layer electrically connected with the first sub-electrode layer; a color filter layer, which is disposed on the first sub-electrode layer, and on which the second sub-electrode layer is disposed; a light emitting layer; and a second electrode layer, which is the other of the anode layer and the cathode layer, and between which and the second sub-electrode layer of the first electrode layer the light emitting layer is disposed.

According to embodiments of the present disclosure, the first electrode layer is the anode layer and the second electrode layer is the cathode layer.

According to embodiments of the present disclosure, the OLED device further includes: a hole injection layer and a hole transport layer which are disposed between the second sub-electrode layer and the light emitting layer; and an electron transport layer disposed between the light emitting layer and the second electrode layer.

According to embodiments of the present disclosure, the color filter layer includes color filters disposed in one-to-one correspondence with sub-pixels of each pixel, there is a gap between two adjacent ones of the color filters, and the second sub-electrode layer is electrically connected with the first sub-electrode layer through the gap.

According to embodiments of the present disclosure, the color filter layer includes color filters disposed in one-to-one correspondence with sub-pixels of each pixel, respectively having same colors as the sub-pixels of each pixel, and having different thicknesses.

According to embodiments of the present disclosure, the color filters of the color filter layer include: a red color filter, a green color filter and a blue color filter, and a thickness of the green color filter is greater than a thickness of the blue color filter and is less than a thickness of the red color filter.

According to embodiments of the present disclosure, the OLED device further includes: an electron blocking layer disposed between the hole transport layer and the light emitting layer.

According to embodiments of the present disclosure, the first sub-electrode layer is a reflecting electrode layer, and the second sub-electrode layer is a transparent conductive film.

According to embodiments of the present disclosure, the OLED device further includes: a pixel defining layer extending upwards from the second sub-electrode layer, located below the second electrode layer, and defining light emitting regions of sub-pixels.

Embodiments of the present disclosure further provide a method of manufacturing an OLED device, the method including: forming a first sub-electrode layer on a substrate; forming a color filter layer on the first sub-electrode layer; forming a second sub-electrode layer on the color filter layer in such a way that the second sub-electrode layer is electrically connected with the first sub-electrode layer, the first sub-electrode layer and the second sub-electrode layer constituting a first electrode layer which is one of an anode layer or a cathode layer; and forming a light emitting layer; and forming a second electrode layer, which is the other of the anode layer and the cathode layer, and between which and the second sub-electrode layer of the first electrode layer the light emitting layer is disposed.

According to embodiments of the present disclosure, the first electrode layer is the anode layer and the second electrode layer is the cathode layer.

According to embodiments of the present disclosure, the method further includes: sequentially forming a hole injection layer and a hole transport layer on the second sub-electrode layer prior to forming the light emitting layer; and forming an electron transport layer on the light emitting layer prior to forming the second electrode.

According to embodiments of the present disclosure, the method further includes: forming a gap in the color filter layer in a position of the color filter layer corresponding to a position between two adjacent ones of sub-pixels of each pixel prior to forming the second sub-electrode layer, wherein the second sub-electrode layer is electrically connected with the first sub-electrode layer through the gap.

According to embodiments of the present disclosure, the method further includes: forming a pixel defining layer on the second sub-electrode layer subsequent to forming the second sub-electrode layer and prior to forming the hole injection layer, wherein the pixel defining layer defines light emitting regions of the sub-pixels.

According to embodiments of the present disclosure, the color filter layer includes color filters disposed in one-to-one correspondence with sub-pixels of each pixel, respectively having same colors as the sub-pixels of each pixel, and having different thicknesses.

According to embodiments of the present disclosure, the color filters of the color filter layer include: a red color filter, a green color filter and a blue color filter, and a thickness of the green color filter is greater than a thickness of the blue color filter and is less than a thickness of the red color filter.

According to embodiments of the present disclosure, the first sub-electrode layer is a reflecting electrode layer, and the second sub-electrode layer is a transparent conductive film.

Embodiments of the present disclosure further provide a display panel including: the above OLED device.

Additional aspects and advantages of the present disclosure will be set forth in part in the description which follows and, in part, will be apparent from the description, or may be learned by practice of the embodiments of the present disclosure.

BRIEF DESCRIPTION OF THE DRAWINGS

The above and/or additional aspects and advantages of embodiments of the present disclosure will be apparent and more readily appreciated from the following description of the embodiments taken in conjunction with the accompanying drawings, in which.

DETAILED DESCRIPTION

Figure 1:
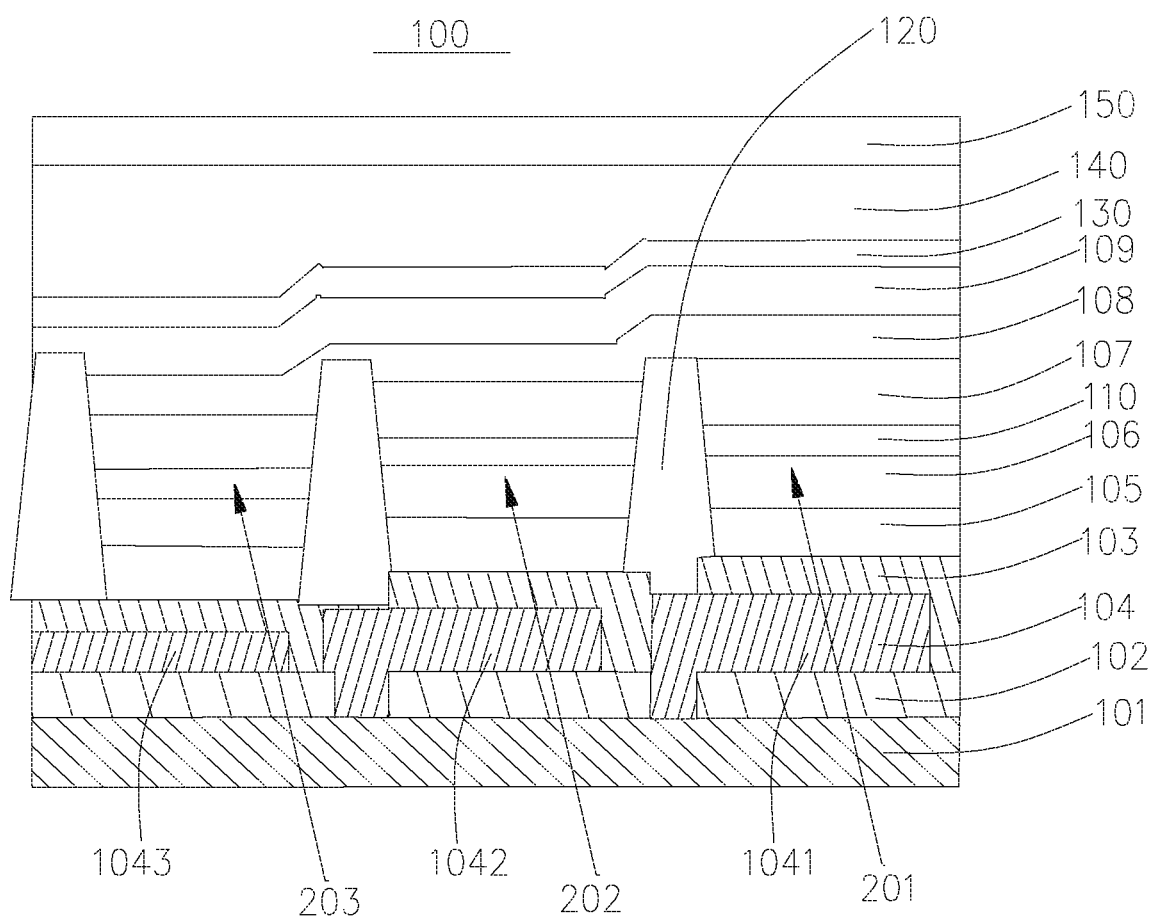
FIG. 1 is a schematic view showing a structure of an OLED device according to an embodiment of the present disclosure.

Reference will now be made in detail to the embodiments of the present disclosure, examples of which are illustrated in the accompanying drawings. Like reference numerals refer to like elements or elements having like function throughout. The embodiments described below with reference to the accompany drawings are illustrative, are only used to explain the embodiments of present disclosure, and should not be construed to limit the present disclosure.

Referring to FIG. 1, embodiments of the present disclosure provide an OLED device 100. The OLED device 100 includes: a substrate 101, a first electrode layer 102, 103, a color filter layer 104, a light emitting layer 107 and a second electrode layer 109. The first electrode layer 102, 103 includes: a first sub-electrode layer 102 disposed on the substrate 101; and a second sub-electrode layer 103 electrically connected with the first sub-electrode layer 102. The first electrode layer 102, 103 is one of an anode layer or a cathode layer. The color filter layer 104 is disposed on the first sub-electrode layer 102 and the second sub-electrode layer 103 is disposed on the color filter layer 104. The second electrode layer 109 is the other of the anode layer and the cathode layer and the light emitting layer 107 is disposed between the second electrode layer 109 and the second sub-electrode layer 103 of the first electrode layer 102, 103.

According to an example of the present disclosure, as shown in FIG. 1, the first electrode layer 102, 103 is the anode layer and the second electrode layer 109 is the cathode layer. Alternatively, the first electrode layer 102, 103 is the cathode layer and the second electrode layer 109 is the anode layer.

According to an example of the present disclosure, as shown in FIG. 1, the OLED device 100 further includes: a hole injection layer 105 and a hole transport layer 106 which are disposed between the second sub-electrode layer 103 and the light emitting layer 107; and an electron transport layer 108 disposed between the light emitting layer 107 and the second electrode layer 109. The OLED device 100 further includes: a pixel defining layer 120 extending upwards from the second sub-electrode layer 103, located below the second electrode layer 109, and defining light emitting regions of sub-pixels 201, 202, 203.

According to an example of the present disclosure, as shown in FIG. 1, the color filter layer 104 includes color filters 1041, 1042, 1043 disposed in one-to-one correspondence with sub-pixels 201, 202, 203 of each pixel, there is a gap between two adjacent ones of the color filters 1041, 1042, 1043, and the second sub-electrode layer 103 is electrically connected with the first sub-electrode layer 102 through the gap. For example, the color filter layer 104 includes color filters 1041, 1042, 1043 disposed in one-to-one correspondence with sub-pixels 201, 202, 203 of each pixel, respectively having same colors as the sub-pixels 201, 202, 203 of each pixel, and having different thicknesses. The sub-pixels 201, 202, 203 may be a red sub-pixel 201, a green sub-pixel 202, and a blue sub-pixel 203. The color filters of the color filter layer 104 may include: a red color filter 1041, a green color filter 1042 and a blue color filter 1043, and a thickness of the green color filter 1042 is greater than a thickness of the blue color filter 1043 and is less than a thickness of the red color filter 1041. Furthermore, the color filters of the color filter layer 104 may also include color filters of other colors, and the sub-pixels 201, 202, 203 may be sub-pixels of the other colors.

According to an example of the present disclosure, as shown in FIG. 1, the first sub-electrode layer 102 is a reflecting electrode layer, and the second sub-electrode layer 103 is a transparent conductive film.

According to an example of the present disclosure, as shown in FIG. 1, the OLED device 100 includes: a substrate 101, a first anode layer as the first sub-electrode layer 102, a color filter layer 104, a second anode layer as the second sub-electrode layer 103, a hole injection layer 105, a hole transport layer 106, a light emitting layer 107, an electron transport layer 108, and a cathode layer as the second electrode layer 109, which are sequentially stacked. A pixel defining layer 120 is further formed between the second sub-electrode layer 103 and the electron transport layer 108 and is configured to separate a plurality of sub-pixels 201, 202, 203, such as a red sub-pixel 201, a green sub-pixel 202, and a blue sub-pixel 203, of each pixel in a light emitting region.

According to embodiments of the present disclosure, the substrate 101 is a glass substrate.

According to embodiments of the present disclosure, as shown in FIG. 1, the first sub-electrode layer 102 is a reflecting anode adhering to the glass substrate and formed of an Ag or ITO film, and is configured to reflect light incident on the first sub-electrode layer 102. The first sub-electrode layer 102 is formed with an opening at a position corresponding to a boundary between light emitting regions of every two adjacent ones of the sub-pixels 201, 202, 203.

According to embodiments of the present disclosure, as shown in FIG. 1, the color filter layer 104 is disposed on the first sub-electrode layer 102 and fills the openings of the first sub-electrode layer 102. The color filter layer 104 is further provided with color filters 1041, 1042, 1043 in one-to-one correspondence with sub-pixels 201, 202, 203 of each pixel, and there is a gap between two adjacent ones of the color filters 1041, 1042, 1043. In the present embodiment, the sub-pixels 201, 202, 203 may be a red sub-pixel 201, a green sub-pixel 202, and a blue sub-pixel 203, respectively. The color filter layer 104 is provided with a red color filter 1041, a green color filter 1042 and a blue color filter 1043, and a thickness of the green color filter 1042 is greater than a thickness of the blue color filter 1043 and is less than a thickness of the red color filter 1041. According to embodiments of the present disclosure, as shown in FIG. 1, the second sub-electrode layer 103 is a transparent conductive film, and may be an ITO film. The second sub-electrode layer 103 is disposed on the color filter layer 104, and is electrically connected with the first sub-electrode layer 102 through the gap in the color filter layer 104.

In the OLED device 100 according to the embodiments of the present disclosure, the color filter layer 104 is provided so that it can absorb most of light externally entered, thereby avoiding use of a polarizing filter. In addition, the color filters 1041, 1042, 1043 of the color filter layer 104 corresponding to microcavities of different light emitting regions have different thicknesses. Therefore, it may be unnecessary to dispose additional hole transport layers in a green OLED and a red OLED, reducing a thickness of the OLED device 100 and also increasing a yield of the product.

According to embodiments of the present disclosure, as shown in FIG. 1, the pixel defining layer 120 defines light emitting regions of the sub-pixels 201, 202, 203 and is configured to separate the different sub-pixels 201, 202, 203, thereby avoiding an occurrence of a color mixture phenomenon. In the present embodiment, the pixel defining layer 120 has one end connected to the second sub-electrode layer 103 and/or the color filter layer 104 between the second sub-electrode layers 103 of two adjacent OLEDs, and the other end extending to the electron transport layer 108. In other embodiments, the pixel defining layer 120 may also extend from the second sub-electrode layer to another layer that is located below the second electrode layer and above the hole transport layer.

According to embodiments of the present disclosure, as shown in FIG. 1, the OLED device 100 further includes an electron blocking layer 110 disposed between the light emitting layer 107 and the hole transport layer 106, and configured to prevent electrons from permitting from the light emitting layer 107 into the hole transport layer 106, ensuring that the electrons and holes combine only in the light emitting layer 107 and thus improving a light emitting efficiency.

According to embodiments of the present disclosure, as shown in FIG. 1, the OLED device 100 further includes a first inorganic substance layer 130, an organic substance layer 140, and a second inorganic substance layer 150, which are sequentially disposed on the second electrode layer 109.

Figure 2:
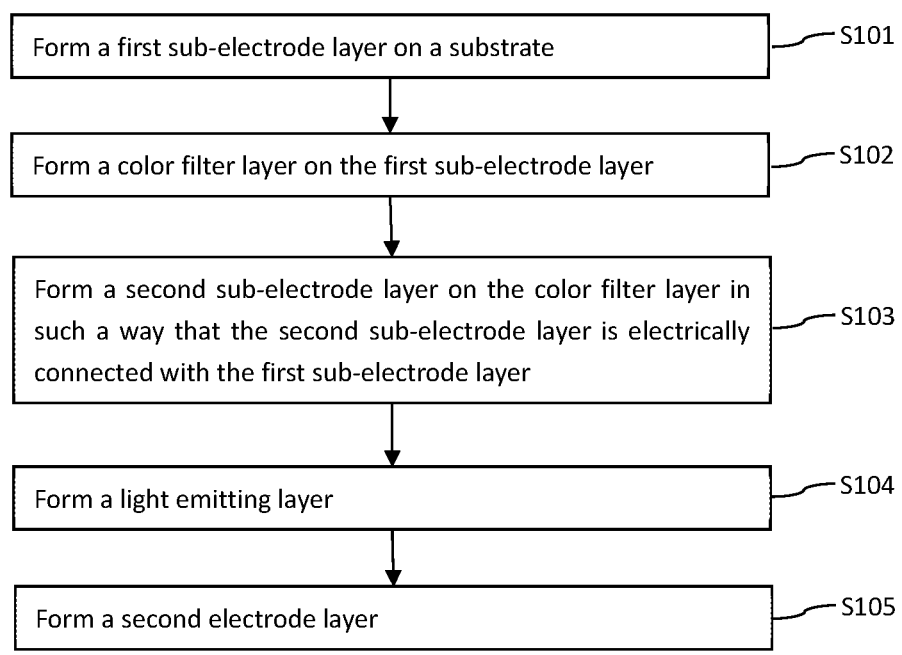
FIG. 2 is a schematic flow diagram of a method of manufacturing an OLED device according to an embodiment of the present disclosure.

As shown in FIG. 2, embodiments of the present disclosure further provide a method of manufacturing an OLED device 100. The method includes: a step S101 of forming a first sub-electrode layer 102 on a substrate 101; a step S102 of forming a color filter layer 104 on the first sub-electrode layer 102; a step S103 of forming a second sub-electrode layer 103 on the color filter layer 104 in such a way that the second sub-electrode layer 103 is electrically connected with the first sub-electrode layer 102; and a step S104 of forming a light emitting layer 107; and a step S105 of forming a second electrode layer 109. The first sub-electrode layer 102 and the second sub-electrode layer 103 constitute a first electrode layer 102, 103. The first electrode layer 102, 103 is one of an anode layer or a cathode layer. The second electrode layer 109 is the other of the anode layer and the cathode layer and the light emitting layer 107 is disposed between the second electrode layer 109 and the second sub-electrode layer 103 of the first electrode layer 102, 103.

According to embodiments of the present disclosure, as shown in FIG. 1, the first electrode layer 102, 103 is the anode layer and the second electrode layer 109 is the cathode layer. Alternatively, the first electrode layer 102, 103 is the cathode layer and the second electrode layer 109 is the anode layer.

According to embodiments of the present disclosure, referring to FIG. 1, the method of manufacturing the OLED device 100 further includes: sequentially forming a hole injection layer 105 and a hole transport layer 106 on the second sub-electrode layer 103 prior to forming the light emitting layer 107; and forming an electron transport layer 108 on the light emitting layer 107 prior to forming the second electrode 109. For example, the method of manufacturing the OLED device 100 further includes: forming a gap in the color filter layer 104 in a position of the color filter layer 104 corresponding to a position between two adjacent ones of sub-pixels 201, 202, 203 of each pixel prior to forming the second sub-electrode layer 103. The second sub-electrode layer 103 is electrically connected with the first sub-electrode layer 102 through the gap. The method of manufacturing the OLED device 100 may further include: forming a pixel defining layer 120 on the second sub-electrode layer 103 subsequent to forming the second sub-electrode layer 103 and prior to forming the hole injection layer 105. The pixel defining layer 120 defines light emitting regions of the sub-pixels 201, 202, 203.

According to embodiments of the present disclosure, referring to FIG. 1, the color filter layer 104 includes color filters 1041, 1042, 1043 disposed in one-to-one correspondence with sub-pixels 201, 202, 203 of each pixel, respectively having same colors as the sub-pixels 201, 202, 203 of each pixel, and having different thicknesses. The sub-pixels 201, 202, 203 may be a red sub-pixel 201, a green sub-pixel 202, and a blue sub-pixel 203, respectively. The color filters of the color filter layer 104 may include: a red color filter 1041, a green color filter 1042 and a blue color filter 1043, and a thickness of the green color filter 1042 is greater than a thickness of the blue color filter 1043 and is less than a thickness of the red color filter 1041. Furthermore, the color filters of the color filter layer 104 may also include color filters of other colors, and the sub-pixels 201, 202, 203 may be sub-pixels of the other colors.

According to embodiments of the present disclosure, as shown in FIG. 1, the first sub-electrode layer 102 is a reflecting electrode layer, and the second sub-electrode layer 103 is a transparent conductive film.

According to an example of the present disclosure, referring to FIG. 1, a method of manufacturing an OLED device 100 includes the following steps.

Firstly, an Ag or ITO film is formed on a glass substrate, serving as a substrate 101, to form a first anode layer (i.e. a reflecting anode) serving as a first sub-electrode layer 102.

Next, a color filter layer 104 is provided on the first sub-electrode layer 102, with a corresponding gap provided in the color filter layer 104.

After that, an ITO film is provided on the color filter layer 104 and a second anode layer serving as a second sub-electrode layer 103 is formed, and the second sub-electrode layer 103 is electrically connected with the first sub-electrode layer 102 through the gap in the color filter layer 104.

Then, a pixel defining layer 120 is provided on the second sub-electrode layer 103, and the pixel defining layer 120 defines light emitting regions of the sub-pixels 201, 202, 203.

Finally, a hole injection layer 105, a hole transport layer 106, an electron blocking layer 110, a light emitting layer 107, an electron transport layer 108, a cathode layer as a second electrode layer 109, a first inorganic substance layer 130, an organic substance layer 140, and a second inorganic substance layer 150 are sequentially formed on the second sub-electrode layer 103.

With the OLED device 100 produced by the method, the color filters 1041, 1042, 1043 of the color filter layer 104 corresponding to microcavities of different light emitting regions have different thicknesses. Therefore, it may be unnecessary to dispose additional hole transport layers in a green OLED and a red OLED, reducing a thickness of the OLED device 100 and increasing a yield of the product.

Embodiments of the present disclosure further provide a display panel including the above OLED device 100. Since use of a polarizing filter is reduced, a thickness of the display panel is decreased, and a light output efficiency of the display panel is increased.

In the OLED device 100 according to the embodiments of the present disclosure, the color filter layer is disposed on the first sub-electrode layer 102 (for example a reflecting anode) so that it can absorb most of light externally entered, thereby preventing the device from displaying in a bright state when it is not turned on and avoiding use of a polarizing filter and thus reducing a thickness of the device. In addition, the color filter has different thicknesses at different microcavities. Therefore, it may be unnecessary to dispose additional hole transport layers in a green OLED and a red OLED, thereby avoiding use of additional fine metal masks, reducing a thickness of the device and increasing a yield of the product.

The foregoing is only some of embodiments of the present disclosure. It should be pointed out that those skilled in the art may also make various changes and modifications to the embodiments without departing from the principles of the present disclosure, and these changes and modifications should also be regard as falling within the protection scope of the present disclosure.

What is claimed is:

1. An organic light-emitting diode device comprising:
   a substrate;
   a first electrode layer, wherein the first electrode layer is one of an anode layer or a cathode layer, and the first electrode layer comprises a first sub-electrode layer disposed on the substrate and a second sub-electrode layer electrically connected with the first sub-electrode layer;
   a color filter layer disposed on a side of the second sub-electrode layer close to the substrate;
   a light emitting layer;
   a second electrode layer, wherein the second electrode layer is the other of the anode layer or the cathode layer, and the light emitting layer is disposed between the second electrode layer and the second sub-electrode layer of the first electrode layer; and
   a pixel defining layer extending from the second sub-electrode layer in a direction away from the substrate, located below the second electrode layer; and defining light emitting regions of sub-pixels,
   wherein the color filter layer is configured to adjust a light emitted by the light emitting layer; and
   wherein an orthographic projection of the pixel defining layer on the substrate overlaps with an orthographic projection of the color filter layer on the substrate.

2. The organic light-emitting diode device of claim 1, wherein:
   the first electrode layer is the anode layer and the second electrode layer is the cathode layer.

3. The organic light-emitting diode device of claim 2, further comprising:
   a hole injection layer and a hole transport layer, wherein the hole injection layer and the hole transport layer are disposed between the second sub-electrode layer and the light emitting layer; and
   an electron transport layer disposed between the light emitting layer and the second electrode layer.

4. The organic light-emitting diode device of claim 1, wherein:
   the color filter layer comprises color filters disposed in one-to-one correspondence with sub-pixels of each pixel.

5. The organic light-emitting diode device of claim 1, wherein:
   the color filter layer comprises color filters disposed in one-to-one correspondence with sub-pixels of each pixel, respectively having same colors as the sub-pixels of each pixel, and having different thicknesses.

6. The organic light-emitting diode device of claim 5, wherein:
   the color filters of the color filter layer comprise: a red color filter, a green color filter and a blue color filter, and a thickness of the green color filter is greater than a thickness of the blue color filter and is less than a thickness of the red color filter.

7. The organic light-emitting diode device of claim 1, wherein:
   the first sub-electrode layer is a reflecting electrode layer, and the second sub-electrode layer is a transparent conductive film.

8. The organic light-emitting diode device of claim 1, wherein a thickness of the pixel defining layer is greater than a thickness of the color filter layer.

9. A display panel comprising:
   the organic light-emitting diode device according to claim 1.

10. The organic light-emitting diode device of claim 1, wherein:
    the first sub-electrode layer is formed with a gap at a position corresponding to a boundary between light emitting regions of every two adjacent ones of the sub-pixels, and the color filter layer is disposed on the first sub-electrode layer and fills the gap of the first sub-electrode layer.

11. The organic light-emitting diode device of claim 1, wherein:
    the pixel defining layer has one end connected to at least one of the second sub-electrode layer or a portion of the color filter layer between second sub-electrode layers of two adjacent organic light-emitting diodes.

12. A method of manufacturing an organic light-emitting diode device, the method comprising:
    forming a first sub-electrode layer on a substrate;
    forming a color filter layer on the first sub-electrode layer;
    forming a second sub-electrode layer on the color filter layer in such a way that the second sub-electrode layer is electrically connected with the first sub-electrode layer, the first sub-electrode layer and the second sub-electrode layer constituting a first electrode layer wherein the first electrode layer is one of an anode layer or a cathode layer; and forming a light emitting layer; and forming a second electrode layer, wherein the second electrode layer is the other of the anode layer or the cathode layer, and the light emitting layer is disposed between the second electrode layer and the second sub-electrode layer of the first electrode layer, wherein the color filter layer is configured to adjust a light emitted by the light emitting layer; and wherein the organic light-emitting diode device comprises a pixel defining layer extending from the second sub-electrode layer in a direction away from the substrate, located below the second electrode layer, and defining light emitting regions of sub-pixels, wherein an orthographic projection of the pixel defining layer on the substrate overlaps with an orthographic projection of the color filter layer on the substrate.

13. The method of claim 12, wherein:

the first electrode layer is the anode layer and the second electrode layer is the cathode layer.

14. The method of claim 13, further comprising:

sequentially forming a hole injection layer and a hole transport layer on the second sub-electrode layer prior to forming the light emitting layer; and forming an electron transport layer on the light emitting layer prior to forming the second electrode.

15. The method of claim 14, further comprising:

forming the pixel defining layer on the second sub-electrode layer subsequent to forming the second sub-electrode layer and prior to forming the hole injection layer.

16. The method of claim 12, wherein:

the color filter layer comprises color filters disposed in one-to-one correspondence with sub-pixels of each pixel, respectively having same colors as the sub-pixels of each pixel, and having different thicknesses.

17. The method of claim 16, wherein:

the color filters of the color filter layer comprise: a red color filter, a green color filter and a blue color filter, and a thickness of the green color filter is greater than a thickness of the blue color filter and is less than a thickness of the red color filter.

18. The method of claim 12, wherein:

the first sub-electrode layer is a reflecting electrode layer, and the second sub-electrode layer is a transparent conductive film.

* * * * *